United States Patent [19]

L'Yee

[11] Patent Number: 5,705,422
[45] Date of Patent: Jan. 6, 1998

[54] METHOD FOR FORMING WELL OF SEMICONDUCTOR DEVICE

[75] Inventor: Hyeok-Jae L'Yee, Cheongju, Rep. of Korea

[73] Assignee: LG Semicon Co., Ltd., Choongcheongbuk-do, Rep. of Korea

[21] Appl. No.: 773,594

[22] Filed: Dec. 27, 1996

[30] Foreign Application Priority Data

Dec. 28, 1995 [KR] Rep. of Korea ............... 62055/1995

[51] Int. Cl.$^6$ ................................................. H01L 21/76
[52] U.S. Cl. ................... 437/69; 437/52; 437/152; 437/26; 437/28
[58] Field of Search .................. 437/25, 26, 69, 437/70, 56, 34, 52, 152, 28

[56] References Cited

U.S. PATENT DOCUMENTS

| | | | |
|---|---|---|---|
| 4,931,406 | 6/1990 | Tomioka | 437/34 |
| 5,292,671 | 3/1994 | Odanaka | 437/29 |
| 5,397,734 | 3/1995 | Iguchi et al. | 437/52 |
| 5,451,530 | 9/1995 | Bell et al. | 437/26 |

*Primary Examiner*—Trung Dang
*Attorney, Agent, or Firm*—Morgan, Lewis & Bockius LLP

[57] ABSTRACT

A method for forming a well of a semiconductor device sequentially forms a buffer film, an oxidizable film, and an oxidation-blocking film on a periphery area of a semiconductor substrate. A predetermined part of the oxidation-blocking film is etched to partially expose a surface of the oxidizable film and a thermal oxidation is performed to form a field oxide film on a region of the periphery area where the oxidizable film is exposed and on a cell area where the substrate is exposed. The oxidation-blocking film, the oxidizable film, and the buffer film are removed. Impurity ions of a first conductivity type are implanted using high energy. Impurity ions of a second conductivity type are implanted using low energy by using the field oxide film as a mask. The field oxide film is removed and a diffusion is performed to form wells of the first and second conductivity types.

21 Claims, 5 Drawing Sheets

METHOD FOR FORMING WELL OF SEMICONDUCTOR DEVICE

BACKGROUND OF THE INVENTION

1. Field of the Invention

The present invention relates to a method for forming a semiconductor device, and more particularly, to a method for forming a well of a semiconductor device.

2. Discussion of the Related Art

In general, a semiconductor chip is composed of a cell area (CA) on which memory cells are arranged, and a periphery area (PA) on which the related driving circuits are arranged. There usually is a step difference of several thousand angstroms between the cell area and the periphery area.

When such a step difference is generated, it causes problems in the subsequent contact forming processes, for example, interconnections forming process, fine patterning process, and other similar processes. In other words, the depth of focus of an aligner deviates from a limit during a photolithography process due to the step difference. Thus, it is difficult to control the critical dimension (CD) of a pattern. For example, a part that deviates from the limit of the depth of focus is usually not etched well. Since the residue (from the poor etching) remains intact, it is difficult to obtain the desired pattern.

This is even more problematic for a DRAM device where a capacitor not formed on the periphery area is usually loaded on the cell area. This causes the height of the cell area to be even higher, thereby increasing the step difference.

As the integration of semiconductor devices increases, the line width or the contact size in a chip decreases. Thus, a reduced pattern size in the sub-micron region (less than 1.0 µm) is usually required. In turn, it becomes important to minimize the step difference between the cell area and the periphery area.

One widely used method for minimizing the step difference uses a planarization technology. Another method for accomplishing the same purpose uses a cell recess technology.

The cell recess technology etches the silicon of a cell area before manufacturing the main device. This compensates for the increase in the height of the cell area as compared to that of the periphery area. A conventional process for forming a well of a semiconductor device by using the cell recess technology will now be described with reference to FIGS. 1A to 1L.

As shown in FIG. 1A, a first oxide film 12 (of a buffer film) and a first nitride film 14 (of an oxidation-blocking film) are sequentially deposited on a silicon substrate 10. As shown in FIG. 1B, a photoresist film 16 is then formed on a periphery area on the nitride film 14 through a photolithography process. Using the photoresist film 16 as a mask, the first nitride film 14 and the first oxide film 12 are selectively etched away. Then, the photoresist film 16 is removed. This defines a cell area (CA) and a periphery area (PA). In order to prevent the oxidation of the periphery area during the subsequent processes, the nitride film 14 having a larger resistance to oxidation is formed on the periphery area, as described above.

As shown in FIG. 1C, a thermal oxidation is then carried out at a high temperature, thereby forming a 10000 Å-thick field oxide film 18 on the cell area. As shown in FIG. 1D, the first nitride film 14 and the first oxide film 12 in the periphery area (where no field oxide film 18 is formed) are then removed.

As shown in FIG. 1E, the field oxide film 18 is removed. As a result, the cell area where the field oxide film 18 is formed has a structure in that the surface of the substrate has a recess of about 5000 Å relative to the periphery area where no field oxide film is formed. Next, on the entire surface of the substrate 10 having the above structure, a second oxide film 12' (of a buffer film) and a second nitride film 14' (of an oxidation-blocking film) are deposited.

Next, as shown in FIG. 1F, a photoresist film (not shown) for forming a P-well is patterned on the second nitride film 14'. Using the photoresist film as a mask, the second nitride film 14' and the second oxide film 12' are selectively removed. After removing the photoresist film pattern, a P-type impurity ion is implanted.

As shown in FIG. 1G, a thermal oxidation is carried out at a high temperature to grow an oxide film 20 on the substrate where it is not covered by the second nitride film 14'. Then, as shown in FIG. 1H, the second nitride film 14' and the second oxide film 12' are removed. In order to form an N-well, an N-type impurity ion is implanted using the oxide film 20 as a mask.

As shown in FIG. 1I, a drive-in process is then carried out to form a P-well 22 and an N-well 24, thereby completing the well formation process.

However, the conventional method for forming the well of a semiconductor device has several problems.

First, after recessing the cell area, an additional oxidation process is required for forming the N-well and P-well. Thus, two oxidation processes are required in order to form the well.

Second, multi-step processes are required, such as the deposition and removal of the first nitride film and first oxide film, and the deposition and removal of the second nitride film and second oxide film. This complicates the fabrication process and reduces the productivity.

Furthermore, the conventional method has poor flexibility and low efficiency, as explained below. To form a well of a semiconductor by using high energy ion implantation, a thin oxide film is grown on the substrate. Then, after growing a field oxide film through a LOCOS technology, an ion implantation process for forming an N-well or a P-well is carried out. Next, a heat treatment is carried out for about 30 to 60 minutes at a temperature of around 1000° C., thereby forming the N-well and the P-well.

More specifically, when forming an N-well, a photoresist film having a thickness of 4 µm to 5 µm are formed to expose only the surface of the oxide film of the region where the N-well is to be formed. Then, using the photoresist film as a mask, the high energy ion implantation of N-type impurity is carried out. Similarly, for forming a P-well, a photoresist film having a thickness of 4 µm to 5 µm are formed so as to expose only the surface of the oxide film of the region where the P-well is to be formed. Then, using the photoresist film as a mask, the high energy ion implantation of P-type impurity is carried out.

In this process, the thick photoresist film (more than 4 µm) is used for high energy ion implantation when forming both the P-well and the N-well. This reduces the process flexibility and productivity. In addition, during the high energy ion implantation, the chemical component of the photoresist film changes and the particle of the photoresist film may cause defects of the silicon lattice.

SUMMARY OF THE INVENTION

Accordingly, the present invention is directed to a method for forming a well of a semiconductor device that substantially obviates one or more of the problems due to limitations and disadvantages of the related art.

An object of the present invention is to provide a method for forming a well of a semiconductor device with improved latch-up characteristics, simplified manufacturing process, and reduced step difference.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method for forming a well of a semiconductor device of the present invention includes the steps of sequentially forming a buffer film, an oxidizable film, and an oxidation-blocking film on a semiconductor substrate; defining a cell area and a periphery area on the semiconductor substrate; selectively removing the oxidation-blocking film to expose a portion of the oxidizable film; forming a field oxide film on the exposed portion of the oxidizable film and on the cell area; removing the oxidation-blocking film, the oxidizable film, and the buffer film; implanting an impurity of a first conductivity type; implanting an impurity of a second conductivity type by using the field oxide film as a mask; removing the field oxide film; and forming a first conductivity type well and a second conductivity type well through diffusion.

In another aspect, a method for forming a well of a semiconductor device of the present invention includes the steps of sequentially forming a buffer film, an oxidizable film and an oxidation-blocking film on a periphery area of a semiconductor substrate; etching a predetermined part of the oxidation-blocking film so as to partially expose the surface of the oxidizable film; performing a thermal oxidation to thereby form a field oxide film on a region of the periphery area where the oxidizable film is exposed and on a cell area where the surface of the substrate is exposed; removing the oxidation-blocking film, the oxidizable film and the buffer film; implanting an impurity ion of a first conductivity with a high energy; implanting an impurity ion of a second conductivity with a low energy, using the field oxide film as a mask; and removing the field oxide film and performing a diffusion to thereby form wells of the first and second conductivities.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2G are cross-sectional views showing the sequence of steps for forming a well of a semiconductor device according to the present invention. The manufacturing process will now be described with reference to FIGS. 2A–2G in more detail.

Figure 1A:
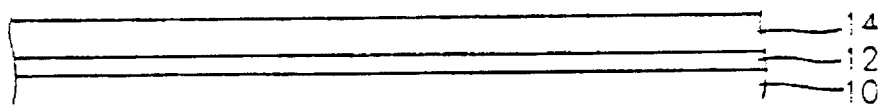
FIGS. 1A to 1I are cross-sectional views illustrating a method for forming a well of a semiconductor device according to a conventional method.
Figure 1B:
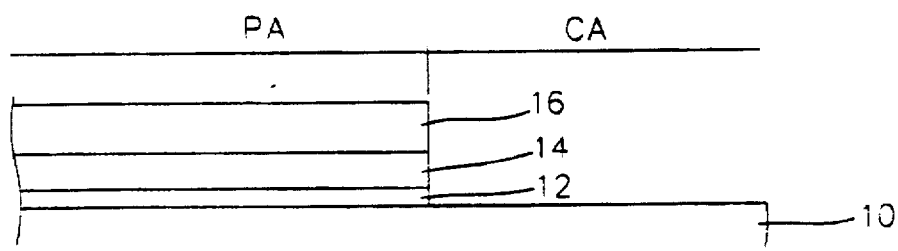
Figure 1C:
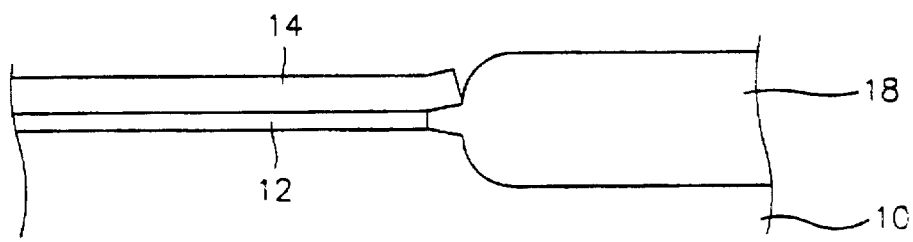
Figure 1D:
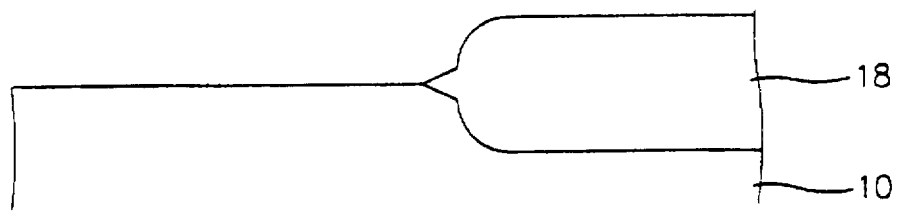
Figure 1E:
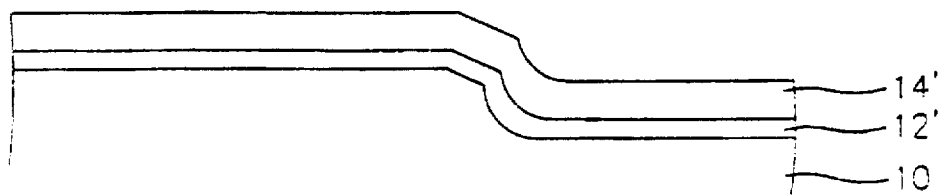
Figure 1F:
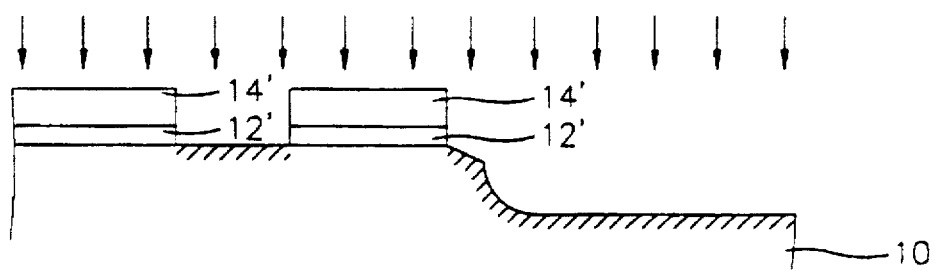
Figure 1G:
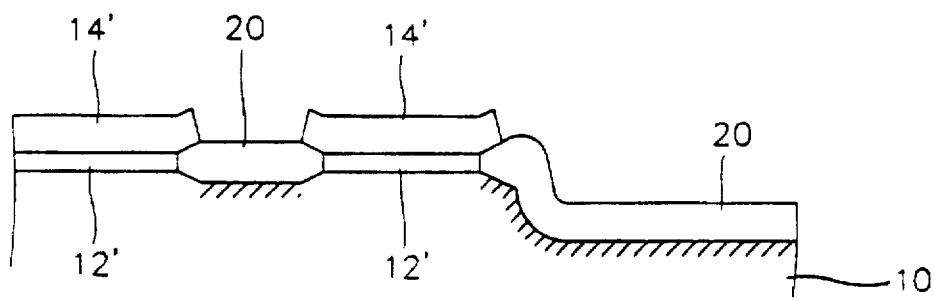
Figure 1H:
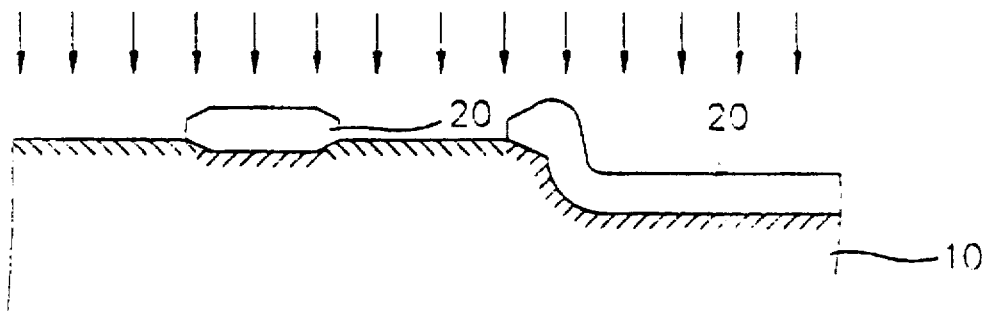
Figure 1I:
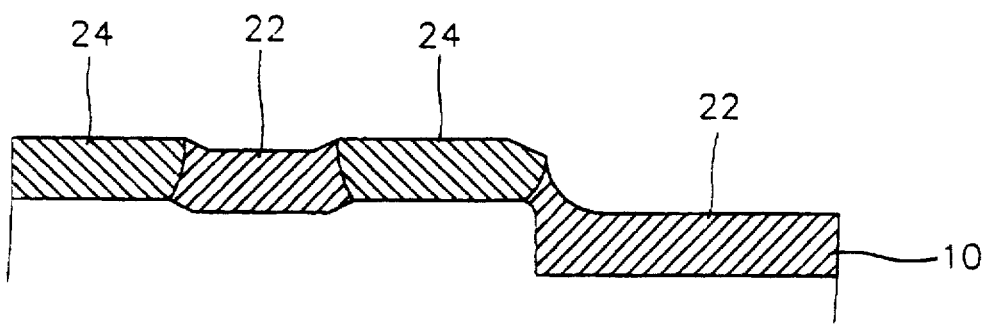
Figure 2A:
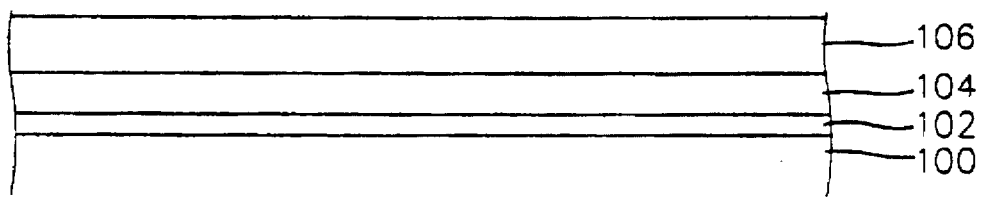
FIGS. 2A to 2G are cross-sectional views illustrating a method for forming a well of a semiconductor device according to the present invention.

As shown in FIG. 2A, an oxide film 102 (of a buffer film) is formed to a thickness of 50 Å to 300 Å on a silicon substrate 100. Then, a polycrystalline silicon film 104 (of an oxidizable film) and a nitride film 106 (of an oxidation-blocking film) are sequentially deposited on the oxide film 102.

Figure 2B:
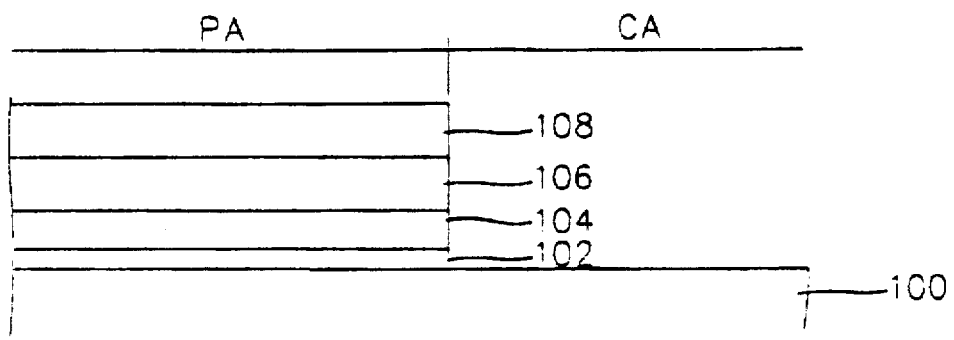

As shown in FIG. 2B, after coating a photoresist film 108 on the nitride film 106, the photoresist film 108 is partially removed by exposure at a region where a cell is to be formed. Using the patterned photoresist film 108 as a mask, the nitride film 106, the polycrystalline silicon film 104, and the oxide film 102 are etched away. Then, the photoresist film is removed to define a cell area (CA) and a periphery area (PA).

Figure 2C:
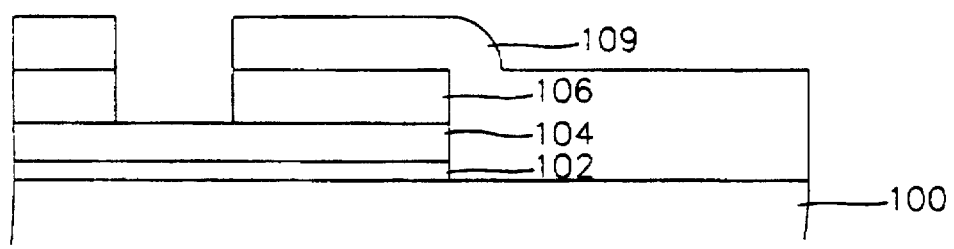
Figure 2D:
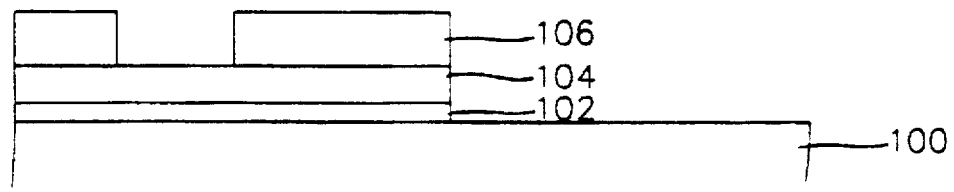

As shown in FIG. 2C, after coating another photoresist film 109 on the entire surface of the substrate including the nitride film 106, the photoresist film 109 is partially removed by exposure at a region where an NMOS is to be formed. Then, using the patterned photoresist film as a mask, the nitride film 106 located thereunder is etched away, thereby partially exposing the surface of the polycrystalline silicon film 104. As shown in FIG. 2D, the photoresist film 109 is then removed.

Figure 2E:
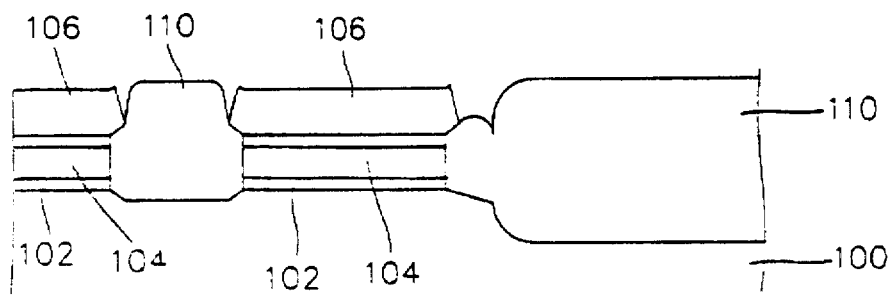

Next, as shown in FIG. 2E, a thermal oxidation process is carried out to form a 10000 Å-thick field oxide film 110 on a region of the periphery area where the polycrystalline silicon film 104 is exposed and on the cell area where the surface of the substrate 100 is exposed.

Figure 2F:
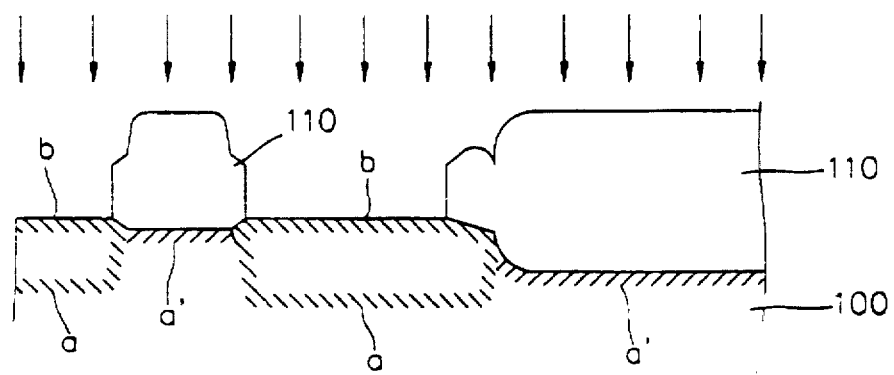

As shown in FIG. 2F, the nitride film 106, the polycrystalline silicon film 104, and the thin oxide film 102 are removed. Then, using an energy sufficiently high enough to penetrate the field oxide film 110 (e.g., a high energy of 2 MeV to 4 MeV), P-type impurity ions are implanted. As a result, in the region where no field oxide film 110 is formed, P-type ion regions ("a") are formed to a predetermined depth from the surface of the substrate. In the region where the field oxide film 110 is formed, other P-type ion regions ("a'") are formed just beneath the surface of the substrate.

Subsequently, using a low energy that is not capable of penetrating the field oxide film 110 (e.g., a low energy of 100 keV to 200 keV), N-type impurity ions are implanted. As a result and as shown in FIG. 2F, N-type ion regions ("b") are formed in the substrate where the field oxide film 110 is not formed and the immediate adjacent area.

Figure 2G:
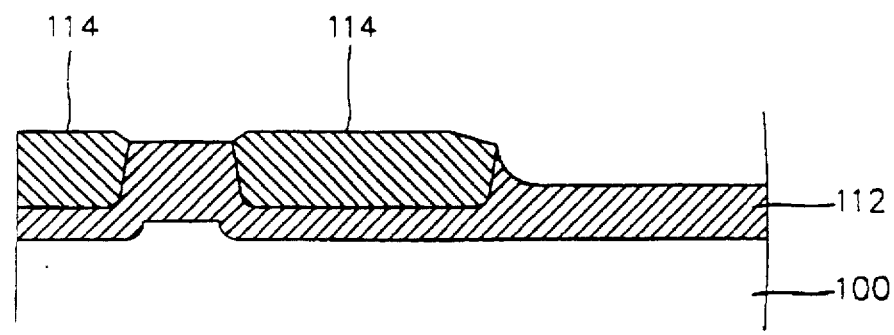

Then, as shown in FIG. 2G, a diffusion process is carried out to form a P-well 112 and an N-well 114. The P-well 112 is formed below the N-well 114, thereby completing the well formation process. As a result, the whole resistance of the P-well is decreased and the latch-up characteristic is improved.

Accordingly, the present invention provides a method for forming a well of a semiconductor device in which a well formation process is carried out so that a P-well is formed below an N-well, thereby improving latch-up characteristic, and realizing a simplified process and a reduced step difference. More particularly, the present invention forms a well of a semiconductor device by using a high energy ion implantation which minimizes a step difference generated when loading a capacitor on a cell area and improves latch-up characteristic.

Thus, as a result of the aforementioned process, it is unnecessary to use the thick photoresist film which was inevitably used in the conventional method during the high energy implantation. Therefore, the defect of the silicon lattice generated due to the particle of the photoresist film can be prevented. In addition, the simplification of process can be accomplished.

The present invention has the following advantages.

First, since only one oxidation process is used to complete the process of forming the N-well and P-well, the manufacturing process is simplified and it in turn leads to a reduced process time and increased productivity.

Second, in the present invention, a thick photoresist film (more than 4 μm) that must be used during the high energy ion implantation of the conventional method, is not needed. This prevents silicon lattice defect caused by photoresist film particles during the high energy ion implantation.

Third, the present invention provides a highly reliable semiconductor device with improved latch-up immunity.

It will be apparent to those skilled in the art that various modifications and variations can be made in the method for forming a well of the present invention without departing from the spirit or scope of the invention. Thus, it is intended that the present invention cover the modifications and variations of this invention provided they come within the scope of the appended claims and their equivalents.

What is claimed is:

1. A method for forming a well of a semiconductor device, the method comprising the steps of:

sequentially forming a buffer film, an oxidizable film, and an oxidation-blocking film on a periphery area of a semiconductor substrate;

etching a portion of the oxidation-blocking film to partially expose a surface of the oxidizable film;

forming a field oxide film on a region of the periphery area where the oxidizable film is exposed and on a cell area where the substrate is exposed;

removing the oxidation-blocking film, the oxidizable film, and the buffer film;

implanting impurity ions of a first conductivity type with a high energy;

implanting impurity ions of a second conductivity type with a low energy by using the field oxide film as a mask;

removing the field oxide film; and forming a first conductivity type well and a second conductivity type well through diffusion.

2. The method as claimed in claim 1, wherein the step of forming the buffer film forms the buffer film to a thickness in a range of approximately 50 Å to 300 Å.

3. The method as claimed in claim 1, wherein the impurity ions of the first conductivity type is implanted using an energy in a range of approximately 2 MeV to 4 MeV.

4. The method as claimed in claim 1, wherein the impurity ions of the second conductivity type is implanted using an energy in a range of approximately 100 keV to 200 keV.

5. The method as claimed in claim 1, wherein the oxidizable film includes a polycrystalline silicon film.

6. The method as claimed in claim 1, wherein the step of forming the first conductivity type well includes diffusing a P-type impurity.

7. The method as claimed in claim 1, wherein the step of forming the second conductivity type well includes diffusing an N-type impurity.

8. A method for forming a well of a semiconductor device, the method comprising the steps of:

sequentially forming a buffer film, an oxidizable film, and an oxidation-blocking film on a semiconductor substrate;

defining a cell area and a periphery area on the semiconductor substrate;

selectively removing the oxidation-blocking film to expose a portion of the oxidizable film;

forming a field oxide film on the exposed portion of the oxidizable film and on the cell area;

removing the oxidation-blocking film, the oxidizable film, and the buffer film;

implanting an impurity of a first conductivity type;

implanting an impurity of a second conductivity type by using the field oxide film as a mask;

removing the field oxide film; and forming a first conductivity type well and a second conductivity type well through diffusion.

9. The method as claimed in claim 8, wherein the step of forming the first conductivity type well includes forming the first conductivity type well below the second conductivity type well.

10. The method as claimed in claim 8, wherein the buffer film is formed to a thickness in a range of approximately 50 Å to 300 Å.

11. The method as claimed in claim 8, wherein the buffer film includes an oxide film.

12. The method as claimed in claim 8, wherein the oxidizable film includes a polycrystalline silicon film.

13. The method as claimed in claim 8, wherein the oxidation-block film includes a nitride film.

14. The method as claimed in claim 8, wherein the step of selectively removing the oxidation-blocking film includes the steps of:

forming a patterned photoresist film on the oxidation-blocking film; and etching the oxidation-blocking film by using the patterned photoresist film as a mask to expose the oxidizable film.

15. The method as claimed in claim 8, wherein the field oxide film is formed with a thickness in a range of approximately 10000 Å.

16. The method as claimed in claim 8, wherein the step of implanting the impurity of the first conductivity type is performed using an energy in a range of approximately 2 MeV to 4 MeV.

17. The method as claimed in claim 8, wherein the step of implanting the impurity of the second conductivity type is performed using an energy in a range of approximately 100 keV to 200 keV.

18. The method as claimed in claim 8, wherein the first conductivity type impurity includes a P-type impurity.

19. The method as claimed in claim 8, wherein the second conductivity type impurity includes an N-type impurity.

20. The method as claimed in claim 8, wherein the step of defining the cell area and the periphery area includes the steps of:

forming a photoresist film on the oxidation blocking film;

patterning the photoresist film to define the cell area and the periphery area; and partially removing the oxidation blocking film, the oxidation film, and the buffer film using the patterned photoresist film as a mask.

21. The method as claimed in claim 8, wherein the step of forming the field oxide film includes the step of performing a thermal oxidation.

* * * * *